(12) United States Patent
Torres et al.

(10) Patent No.: US 7,172,980 B2
(45) Date of Patent: Feb. 6, 2007

(54) PROCESS FOR FABRICATING AN INTEGRATED ELECTRONIC CIRCUIT THAT INCORPORATES AIR GAPS

(75) Inventors: Joaquin Torres, Saint-Martin-le-Vinoux (FR); Vincent Arnal, Grenoble (FR); Laurent Gosset, Grenoble (FR)

(73) Assignees: STMicroelectronics SA, Montrouge (FR); Koninklijke Philips Electronics N.V., Eindhoven (NL)

( * ) Notice: Subject to any disclaimer, the term of this patent is extended or adjusted under 35 U.S.C. 154(b) by 156 days.

(21) Appl. No.: 10/781,565

(22) Filed: Feb. 18, 2004

(65) Prior Publication Data

US 2004/0229454 A1 Nov. 18, 2004

(30) Foreign Application Priority Data

Feb. 18, 2003 (FR) .................................. 03 01978

(51) Int. Cl.
H01L 21/4763 (2006.01)
H01L 21/31 (2006.01)
H01L 21/469 (2006.01)

(52) U.S. Cl. .................. 438/783; 438/619; 438/624

(58) Field of Classification Search ........ 438/780–783, 438/619–624
See application file for complete search history.

(56) References Cited

U.S. PATENT DOCUMENTS

| 5,461,003 A | 10/1995 | Havemann et al. |
| 6,245,658 B1 | 6/2001 | Buynoski |
| 6,265,321 B1 | 7/2001 | Chooi et al. |
| 6,306,754 B1 | 10/2001 | Agarwal |
| 6,509,623 B2 * | 1/2003 | Zhao .................. 438/781 |
| 2002/0028575 A1 | 3/2002 | Besling et al. |
| 2002/0089060 A1 | 7/2002 | Morisaki et al. |
| 2002/0090794 A1 | 7/2002 | Chang et al. |
| 2003/0224591 A1 * | 12/2003 | Latchford et al. ........ 438/619 |

FOREIGN PATENT DOCUMENTS

EP 0 872 887 A2 10/1998
FR 2 784 230 4/2000

OTHER PUBLICATIONS

Kang-Yoon Lee et al., "Monte Carlo Simulation of Energy Dissipation in Electron Beam Lithography Including Secondary Electron Generation", J. Appl. Phys. 67 (12), Jun. 15, 1990, pp. 7560-7567.
Chung-Hui Chen et al., "A Novel Multi-Level Interconnect Scheme With Air As Low K Inter-Metal Dielectric For Ultradeep Submicron Application" Solid-States Electronics 45 (2001), pp. 199-203.

* cited by examiner

*Primary Examiner*—Cuong Nguyen

(57) ABSTRACT

A process for fabricating an integrated electronic circuit comprises the formation of at least one air gap between interconnect elements above only a defined portion of a surface of a substrate, within an interconnect layer. The interconnect layer comprises a sacrificial material and extends beneath an intermediate layer of permeable material. The air gap is formed by removal, through the intermediate layer, of at least part of the sacrificial material by bringing the permeable material into contact with an agent for removing the sacrificial material, to which agent the permeable material is resistant.

12 Claims, 4 Drawing Sheets

US 7,172,980 B2

PROCESS FOR FABRICATING AN INTEGRATED ELECTRONIC CIRCUIT THAT INCORPORATES AIR GAPS

TECHNICAL FIELD OF THE INVENTION

The present invention relates generally to a process for fabricating an integrated electronic circuit that incorporates air gaps placed between certain interconnect elements.

BACKGROUND OF THE INVENTION

An integrated electronic circuit comprises, on the one hand, elements produced by ion implantation in a semiconductor substrate, such as diodes or transistors, and, on the other hand, metallic elements distributed within layers of insulating materials that are placed on top of the substrate. Six to eight layers of insulating materials may be superposed. In general, the metallic elements are interconnects that electrically connect the elements produced by ion implantation in the substrate. They may also be capacitors, coils, inductors or even antennas. They are generally produced using the damascene method or using its variant, dual damascene, known to those skilled in the art.

The electrical behaviour of the metallic elements may be disturbed by electrostatic or electromagnetic coupling effects that appear between these metallic elements when they are placed so as to be particularly close to one another. These coupling effects are stronger the higher the level of integration of the electronic circuit. Those of these coupling effects that are electrostatic in nature may be likened to parasitic capacitances occurring between neighbouring parts of different metallic elements. This is especially the case when the integrated electronic circuit has a pitch of less than 5 microns.

It is known to reduce the electrostatic coupling effects by introducing, between said metallic elements, an insulating material of low dielectric permittivity in the layers within which the metallic elements lie. Thus, layers of polymers and layers of porous materials have been used, these having relative dielectric permittivities of around 2.2 to 2.5. However, the resulting reduction in electrostatic coupling is limited, and insufficient vis-à-vis the currently envisaged level of integration of the electronic circuits.

It is also known to introduce air gaps between neighbouring metallic elements in order to reduce these coupling effects. To do this, after a layer of insulating material has been produced and after metallic elements have been produced in this layer, a hard mask is deposited on the layer, which mask includes apertures in line with certain of the spaces that separate the metallic elements. The insulating material is then etched via said apertures, in order to form trenches. An upper layer is then deposited on the layer of insulating material and in the trenches, so as to close the trenches without filling them. The air gaps thus formed are generally of small dimensions. In particular, parts of insulating material remain between the metallic elements. In addition, such a process requires a specific lithography mask, of high definition and therefore expensive. It also requires precise alignment of this lithography mask relative to the substrate of the integrated electronic circuit.

It is also known to produce metallic elements within a layer of sacrificial material, to continue the production of the circuit by depositing additional layers of insulating material above the layer of sacrificial material, which may also incorporate metallic elements, and then to remove the layer of sacrificial material. The additional layers and the metallic elements that they incorporate are then connected to the substrate of the electronic circuit only via the metallic elements initially produced in the layer of sacrificial material. The integrated electronic circuit then lacks cohesion or mechanical robustness.

SUMMARY OF THE INVENTION

To address the above discussed deficiencies of the prior art, an object of the present invention is to provide a process for fabricating an integrated electronic circuit in which the abovementioned electrostatic and/or electromagnetic coupling effects are reduced, and which does not have the above drawbacks.

The invention relates to a process for fabricating an integrated electronic circuit whereby at least one air gap is formed between interconnect elements above only a defined portion of a surface of a substrate, within an interconnect layer. The interconnect layer comprises a sacrificial material and extends beneath an intermediate layer of permeable material. The air gap is formed by removal, through the intermediate layer, of at least part of the sacrificial material by bringing the permeable material into contact with an agent for removing the sacrificial material, to which agent the permeable material is resistant.

The term "permeable material" is understood within the context of the invention to mean a material through which may pass the agent for removing the sacrificial material without causing any fracture or debonding. In particular, such a material may be porous.

The interconnect elements are, after the process, separated by the air gap, that is to say by a volume not containing dense material. The interconnect elements may, for example, be electrical conducting lines or coils, but also parts of capacitors, integrated antennas, etc., placed approximately parallel to the surface of the substrate.

A first advantage of the invention lies in the fact that the air gap then has a relative dielectric permittivity approximately equal to one. This relative dielectric permittivity value corresponds to the maximum possible reduction in the electrostatic coupling between the interconnect elements for a given arrangement of these elements.

A second advantage of the invention lies in the fact that, after the process, the integrated electronic circuit may, however, exhibit sufficient mechanical robustness. This robustness results from the fact that the intermediate layer of permeable material remains connected to the substrate not only via the interconnect elements but also via those parts of the interconnect layer that were not removed.

According to one method of implementing the invention, the sacrificial material part removed is bounded, in a direction parallel to the surface of the substrate, by part of the interconnect layer formed from a material resistant to the removal agent. The process may then comprise the following steps:

a) a first part of the interconnect layer is formed with a permanent material outside said portion of the surface of the substrate;

b) a second part of the interconnect layer is formed with the sacrificial material inside said portion of the surface of the substrate;

c) the interconnect elements are formed within the second part of the interconnect layer;

d) the intermediate layer of permeable material is deposited on the interconnect layer at least above said portion of the surface of the substrate; and e) all of the sacrificial material of the interconnect layer is removed through the intermediate layer.

According to a variant of this first method of implementing the invention, step b) of forming the second part of the interconnect layer may be carried out before step a) of forming the first part of the interconnect layer.

According to this method of implementation, the intermediate layer remains connected to the substrate via the first part of the interconnect layer, made of permanent material. Optionally, the permanent material may be identical to the permeable material of the intermediate layer.

Optionally, step a) of forming the first part of the interconnect layer, step b) of forming the second part of the interconnect layer, step c) of forming the interconnect elements and step d) of depositing the intermediate layer may be repeated several times before step e) of removing the sacrificial material, so as to form, above the surface of the substrate, a stack comprising several interconnect layers separated by intermediate layers of permeable material. Each interconnect layer comprises a layer of sacrificial material above a respective portion of the surface of the substrate. During step e) of removing the sacrificial material, the sacrificial material of the interconnect layers is removed by bringing the permeable material of the intermediate layers into contact with the agent for removing the sacrificial material so as to form respective air gaps in each of the interconnect layers.

According to another method of implementing the invention, the sacrificial material part removed is selectively determined by a mask impermeable to the removal agent, said mask being placed above the intermediate layer and having at least one aperture in line with said portion of the surface of the substrate. The intermediate layer then remains connected to the substrate after step e) via a remaining part of the sacrificial material (that is to say a part that has not been removed). The process may then comprise the following steps:

a) the interconnect layer is formed with the sacrificial material on the surface of the substrate inside and outside said portion;

b) the interconnect elements are formed within the interconnect layer above said portion of the surface of the substrate;

c) an intermediate layer of permeable material is deposited on the interconnect layer inside and outside said portion of the surface of the substrate;

d) a mask impermeable to the agent for removing the sacrificial material is formed above the intermediate layer, the mask having an aperture corresponding to said portion of the surface of the substrate; and e) part of the sacrificial material of the interconnect layer is selectively removed through the intermediate layer, the selectively removed part of the sacrificial material being bounded by the mask in a direction parallel to the surface of the substrate.

Optionally, step a) of forming the interconnect layer, step b) of forming the interconnect elements and step c) of depositing the intermediate layer according to this method of implementation are repeated several times before step d) of forming the mask, so as to form, above the surface of the substrate, a stack comprising several interconnect layers that are separated by intermediate layers of permeable material. During step e) of removing the sacrificial material, part of the sacrificial material of the interconnect layers is selectively removed by bringing, via the aperture of the mask, the permeable material of the intermediate layers into contact with the agent for removing the sacrificial material so as to form respective air gaps in each of the interconnect layers.

The invention also relates to an integrated electronic circuit comprising:

a) an interconnect layer comprising part of a first material covering a surface of a substrate outside a defined portion of the surface of the substrate, interconnect elements located above said portion of the surface of the substrate, and at least one air gap located between the interconnect elements in said portion of the surface of the substrate; and b) an intermediate layer of permeable material placed above the interconnect layer.

Optionally, the circuit may furthermore include electrical contacts placed within the intermediate layer in a direction approximately perpendicular to the surface of the substrate.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. It should be noted that the functionality associated with any particular apparatus or controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

Other features and advantages of the present invention will become apparent in the description below of three non-limiting illustrative examples, with reference to the appended drawings, in which like reference numerals represent like parts, in which.

DETAILED DESCRIPTION OF THE INVENTION

FIGS. 1a–3b, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged image processing system.

In these figures, for the sake of clarity the dimensions of the various circuit parts have not been drawn to scale. All these figures are sectional views of a semiconductor device comprising various materials attached to an approximately plane surface of a semiconductor substrate. The sectional views are considered in planes perpendicular to the surface of the substrate. In the figures, identical references correspond to identical elements. The substrate is placed in the lower part of each figure and D denotes a direction perpendicular to the surface of the substrate, directed upwards in the figures. The terms "on", "under", "above", "below" and "upper" are used hereafter with reference to the direction D.

Moreover, the elementary process steps carried out using methods known to those skilled in the art will not be explained in detail below. Information is given only regarding the combination of these elementary steps in a defined chronological order of execution that characterizes the invention.

The first method of implementation corresponds to the case in which the sacrificial material part removed from the interconnect layer is bounded, in a direction parallel to the surface of the substrate, by a permanent material (i.e. one that is resistant to the removal agent).

Figure 1A:
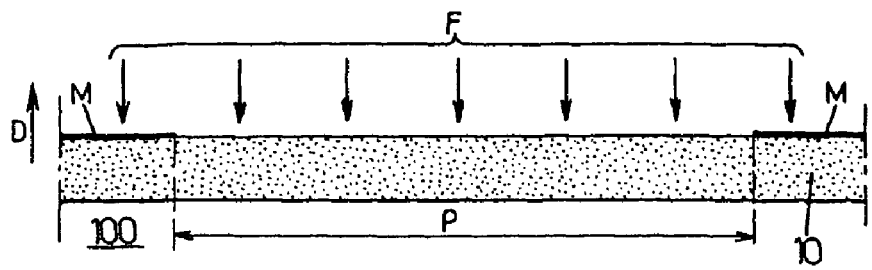
FIGS. 1a to 1f illustrate various steps of a first method of implementing the process of the invention.

As shown in FIG. 1a, a substrate 100 is covered with a layer of a permanent material 10, such as the polymer known by the brand name SiLK, distributed by Dow Chemical. A mask M is formed by lithography on the layer 10, which mask has an aperture above a portion P of the substrate. The layer 10 is then etched by a plasma, forming a flux F of particles that bombard the exposed surface of the layer 10. This is a dry etching process. The mask M can then be removed, leaving that part of the layer 10 remaining outside the portion P of the substrate 100 intact.

Figure 1B:
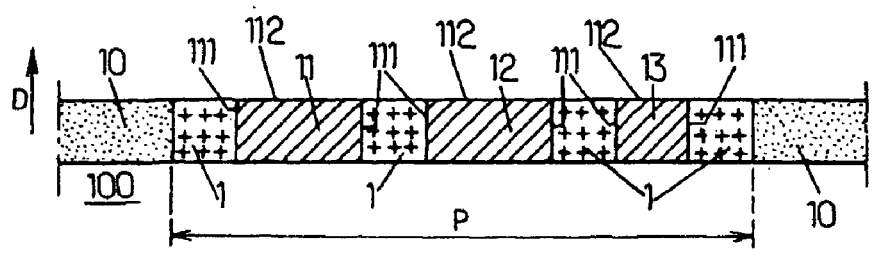

A layer 1 of sacrificial (i.e. non-permanent) material such as silica ($SiO_2$) is then deposited on the portion P of the substrate 100, up to the upper level of the layer 10. Metallic elements 11–13, for example made of copper, are formed in the layer 1 in a manner known to those skilled in the art, for example using the damascene process. The configuration shown in FIG. 1b is then obtained. The metallic elements 11–13 may, for example, be lines approximately parallel to the surface of the substrate 100. Advantageously, they may be covered with a layer of a first barrier material on their lower faces and on their faces 111 parallel to the direction D. The first barrier material may be, as is known, titanium nitride (TiN) or tantalum nitride (TaN). The metallic elements 11–13 may also be covered with a second barrier material on their upper faces 112, especially when they are made of copper. The second barrier material may, for example, be a silicide, optionally nitrided, or an alloy of cobalt (Co), tungsten (W) and phosphorus (P).

The remaining part of the layer 10 and the layer 1, with the metallic elements 11–13, form the first and second parts, respectively, of an interconnect layer of the integrated electronic circuit.

A layer 2 of permeable material, for example SiLK, preferably provided with a structure of open porosity, is formed on the substrate 100, on the layer 10 (outside the portion P) and on the layer 1 and the metallic elements 11–13 (in the portion P). The layer 2 constitutes said intermediate layer.

In a variant of this first method of implementation, the layer 1 and the metallic elements 11–13 may be firstly formed in the portion P of the substrate 100 and then the SiLK permeable material is deposited above the entire substrate 100 so as to form, in a single deposition step, the layer 10 outside the portion P and the layer 2 above the entire substrate 100. A polishing operation is then carried out so as to obtain a plane upper surface of the permeable material. In this variant, the layers 10 and 2 are therefore produced together.

Figure 1C:
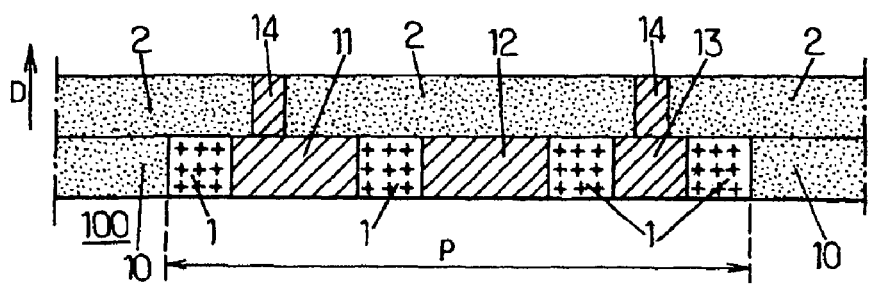

In both cases, metallic elements 14 may then be formed in the layer 2. The elements 14 may be placed above some of the elements 11–13 and constitute, for example, vertical interconnects, also called contacts or vias, that extend approximately along the direction D (FIG. 1c). Like the elements 11–13, the elements 14 may optionally also include layers of first and/or second barrier material on their faces.

Figure 1D:
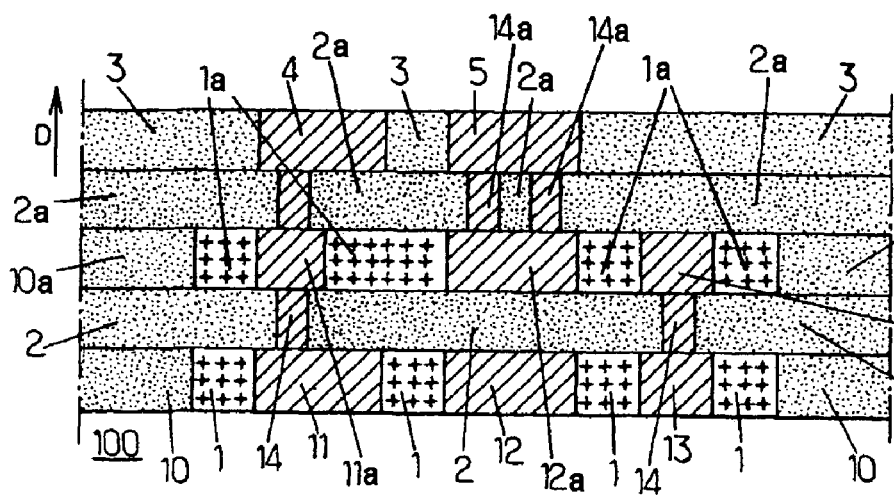

The above steps of depositing the layers 10, 1, 2 and of forming the metallic elements 11–14 correspond to the production of a metallization level of the final circuit. They may be repeated several times so as to obtain the same number of separate metallization levels, each metallization level acting as the substrate for the following metallization level. FIG. 1d shows the substrate 100 after these steps have been repeated once. A layer 1a is another layer of sacrificial material, which may be of the same material as the layer 1, that is to say made of silica. It may be formed in the portion P of the substrate 100 or in a portion of the substrate 100 different from the portion P. The layer 1a is surrounded, parallel to the surface of the substrate 100, by a layer 10a that may also be made of SiLK material identical to that of the layer 10. The layers 1a and 10a may have the same thickness in the direction D. A layer 2a of permeable material covers the layers 1a and 10a and may be of a material identical to that of the layer 2. Metallic elements 11a, 12a and 13a may be placed in the layer 1a and elements 14a may be placed in the layer 2a. The elements 11a–13a and 14a may be of the same type as the elements 11–13 and 14 respectively, but distributed over the substrate 100 independently of them.

A third layer 3 of permeable material may also be formed over the entire substrate 100. It may contain metallic elements 4 and 5. The material of the layer 3 may be identical to the materials of the layers 2 and 2a.

Figure 1E:
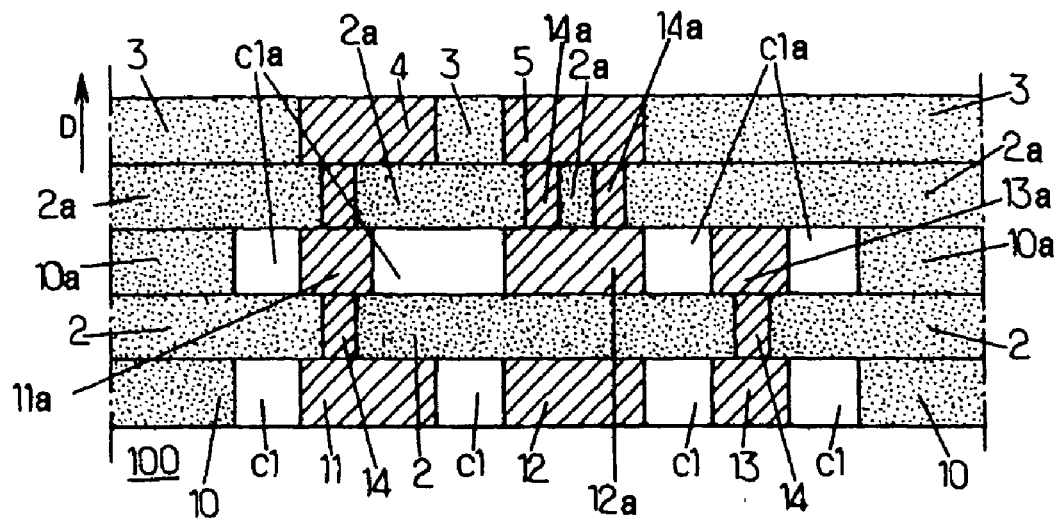

The circuit is then brought into contact via its upper face with a fluid that contains an agent for removing the sacrificial material of the layers 1 and 1a. When the layers 1 and 1a are made of silica, the removal agent may advantageously comprise molecules of hydrogen fluoride (HF) diluted in a carrier fluid. The fluid may be a liquid or a gas and is firstly in contact with the layers 3 and 2a of permeable material. Preferably, it has a low viscosity in order to easily penetrate the pores of the layers 2, 2a and 3. The penetration of the fluid and of the removal agent into the permeable material of the layers 2, 2a and 3 may also take place by it being soluble in and diffusing into the permeable material, especially when the latter is not porous. The silica material of the layer 1a is then progressively degraded or dissolved so that the air gap C1a is formed instead of the material of the layer 1a (FIG. 1e). Next, the fluid passes through the layer 2 and then degrades or dissolves, in the same way, the material of the layer 1. The air gap C1 is formed instead of the layer 1.

When the layer 10a is itself made of permeable material, the removal agent may reach the layer 1 before having degraded all the material of the layer 1a. The layers 1 and 1a may then be partly degraded simultaneously.

In this first method of implementation, the parts of permanent material of the layers 10 and 10a that define the air gaps C1 and C1a parallel to the surface of the substrate 100 may also be made of permeable material. They may then consist of the same material as the layers 2 and 2a. They therefore participate in the removal agent gaining access to the layers 1 and 1a, in particular at their common boundaries with the layers 1 and 1a.

Residues of the materials of the layers 1 and 1a that are initially present in the air gaps C1 and C1a may remain in the permeable materials of the layers 2, 2a and 3. These residues may be removed by a specific treatment. Such a treatment may, for example, be an operation of cleaning the circuit, and in particular the permeable material of the layers 2, 2a and 3, with a fluid containing carbon dioxide in a supercritical state.

The layers of the first and/or second barrier material that are placed on the faces of the metallic elements 11–14 and 11a–14a limit any diffusion of the atoms of these metallic elements, especially during removal of the material of the layers 1 and 1a. They also protect the material of these metallic elements from chemical effects of the removal agent used.

According to another variant of this first method of implementation, the material of the layers 1 and 1a may include carbon atoms or germanium atoms. For example, it is a material of the silicon oxy-hydro-carbide type or a silicon-germanium alloy. The agent for selectively removing such a material may then contain oxygen molecules. For a carbon-based sacrificial material, a plasma containing oxygen ($O_2$) and hydrogen ($H_2$) molecules may be used as removal agent. For a germanium-based sacrificial material, the removal agent may be gaseous oxygen, or water, or else an acid diluted in water.

Alternatively, the material of the layers 1 and 1a may also be a polymer. In this case, the removal agent may contain reducing molecules, such as nitrogen ($N_2$) and hydrogen, or aqueous ammonia ($NH_3$), these being capable of degrading the polymer of the layers 1 and 1a.

The permeable material of the layers 2, 2a and 3 must be chosen so as not to be degraded by the agent for removing the material of the layers 1 and 1a. Depending on said material, it may comprise silicon, carbon and oxygen atoms, and/or an organic polymer, these being incorporated so as to form a material resistant to the removal agent used.

Figure 1F:
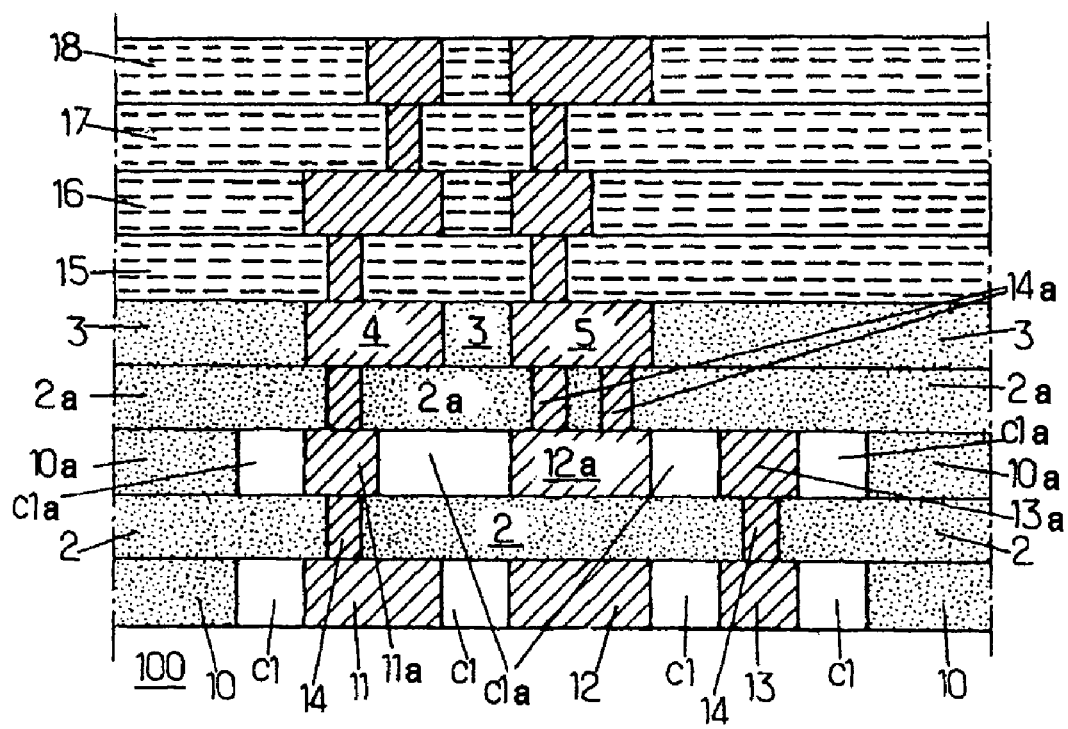

After the material of the layers 1 and 1a has been selectively removed, the upper surface of the circuit is formed by the layer 3 and by the metallic elements 4 and 5. This surface is continuous and plane above the entire surface of the substrate 100. Consequently, it may be used as a support for additional materials deposited on the circuit, so as to complete its fabrication. The fabrication of the circuit is continued in a manner known by those skilled in the art. FIG. 1f shows the finished circuit. It comprises in particular the layers 15–18 corresponding to upper metallization levels in which additional metallic elements may be deposited.

In the circuit thus fabricated, the elements 11–13 on the one hand and the elements 11a–13a on the other are separated by the air gaps C1 and C1a respectively, without insulating material remaining between the elements 11–13 or between the elements 11a–13a. The relative dielectric permittivity values corresponding to these air gaps are of the order of 1.0, corresponding to gaps containing a vacuum or filled with gas, for example air. It follows that the electrostatic coupling between the elements 11, 12 and 13 is reduced to the minimum, as is the electrostatic coupling between the elements 11a, 12a and 13a.

Moreover, the material of the intermediate layer 2 is advantageously chosen so as to have a low dielectric permittivity. The electrostatic coupling between the two groups of metallic elements 11–13 and 11a–13a separated by the layer 2 are therefore reduced.

In some cases, the material of the intermediate layer 2 is chosen according to the dielectric permittivity of the same material taken in the bulk state, that is to say with no porosity. It is chosen so that this dielectric permittivity in the bulk state is low compared with the dielectric permittivity of silica. When this material is porous in the layer 2, its dielectric permittivity is therefore further reduced.

The second method of implementation corresponds to the case in which the sacrificial material part removed from the interconnect layer is bounded, in a direction parallel to the surface of the substrate, by a mask that is impermeable to the removal agent.

An interconnect layer 1 (FIG. 2a) is deposited on the surface of a substrate 100. The layer 1 has a uniform thickness and may also be made of silica. As in the first method of implementation, metallic elements 11–13 are formed in the layer 1, which elements may be electrically conducting lines. The layer 1 is then covered with an intermediate layer 2 of permeable material. The layer 2 may also be made of SiLK material and may include metallic elements 14. The elements 14 are, for example, vias.

A mask M1, having an aperture above a defined portion P1 of the substrate 100, is then formed on the layer 2. The layer M1 is impermeable to the agent for removing the material of the layer 1 that will be used in the rest of the process. It is formed according to one of the methods known by those skilled in the art, such as, for example, lithography. The aperture has dimensions that are large compared with the pitch of the circuit, so that the aperture of the mask M1 may not coincide exactly with the defined portion P1 of the substrate 100 without the subsequent operation of the circuit being impaired.

When the aperture of the mask M1 is produced by photolithography, a photolithography mask is used to define the aperture of the mask M1. It is unnecessary for the photolithography mask to be accurately positioned relative to the circuit, thereby making it possible to save time during fabrication of the circuit. Moreover, the photolithography mask has only an aperture of large size relative to the pitch of the circuit, so that the cost of the photolithography mask is low.

Figure 2A:
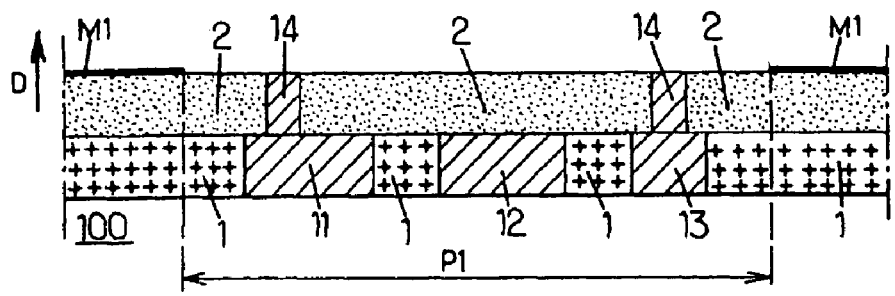
FIGS. 2a to 2d illustrate various steps of a second method of implementing the process of the invention.

The configuration of the circuit shown in FIG. 2a is obtained. The layer 1, with the metallic elements 11–13, again corresponds to the interconnect layer, and the layer 2 is said intermediate layer.

The porous layer 2 is then brought into contact with an agent for removing the material of the layer 1. When the material of the layer 1 is silica, the removal agent may contain hydrogen fluoride (HF) molecules. These molecules are preferably contained in a carrier gas directed onto the upper surface of the layer 2. Given that the mask M1 is impermeable to the removal agent, the porous layer 2 is in contact with the removal agent only within the portion P1 of the substrate 100. The gas containing the removal agent diffuses into the permeable material of the layer 2 from the aperture of the mask M1, in the form of a front that advances towards the layer 1. When it reaches the layer 1, the removal agent consumes the material of the latter and converts it into chemical elements capable of diffusing back through the porous layer 2. The material of the layer 1 is thus removed from the circuit. An air gap C1 (FIG. 2b) is formed in the layer 1, approximately in line with the portion P1 of the substrate 100. Because the carrier gas for the removal agent also diffuses into the porous layer 2 in directions parallel to the surface of the substrate 100, the air gap C1 corresponds to a portion of the substrate 100 slightly larger than the portion P1 initially defined. This effect may be taken into account in the design and the position of the metallic elements 11–13. The metallic elements 11–14 are not impaired by the removal agent.

Optionally, the mask M1 may be removed.

Figure 2B:
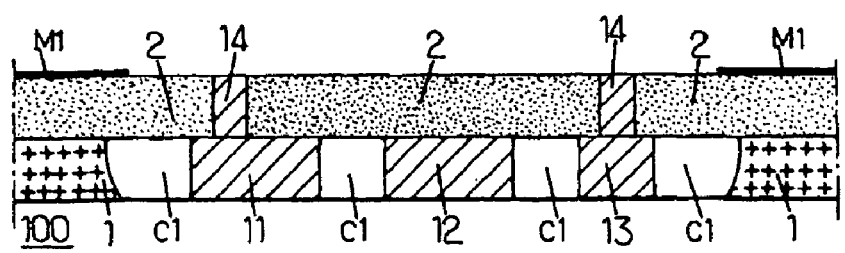
Figure 2C:
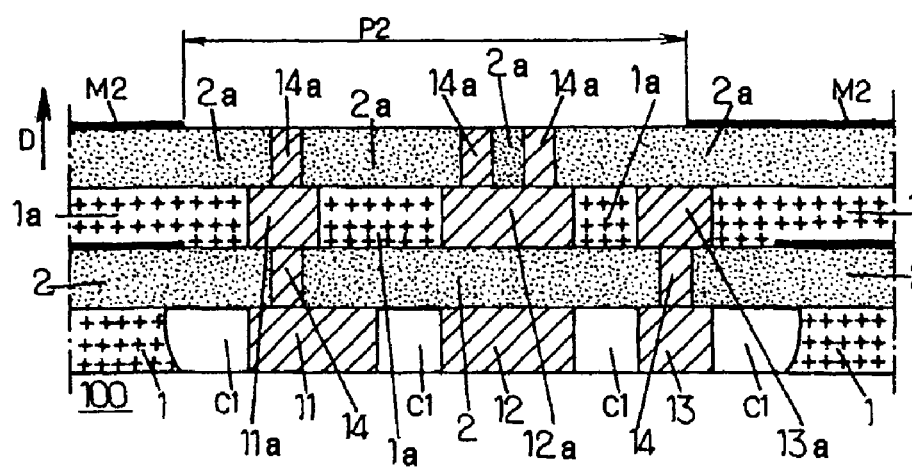
Figure 2D:
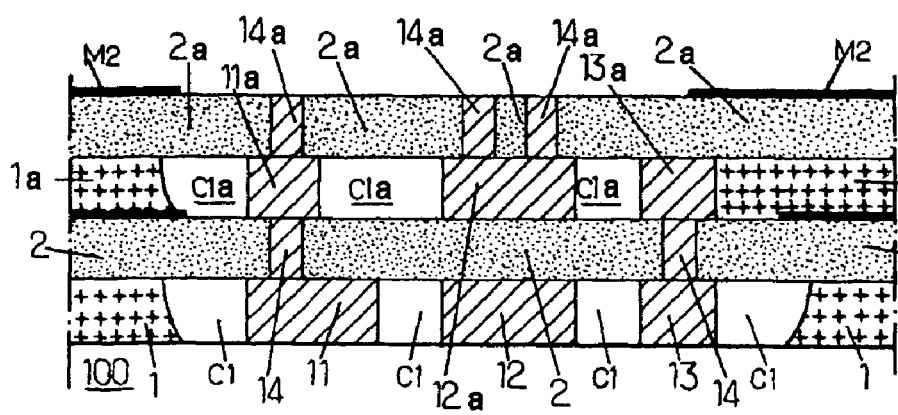

The above steps of forming a silica layer optionally including metallic elements, of forming a porous layer, that may also include metallic elements, and of forming a mask having an aperture may be repeated at least once on the basis of the configuration of the circuit shown in FIG. 2b. The configuration of the circuit shown in FIG. 2c is then obtained. The circuit includes a second layer 1a of sacrificial material, which may, but not necessarily, again be silica, and a second porous layer 2a of the same type as the layer 2, which again may be SiLK material. Metallic elements 11a–13a and 14 may be placed in the layers 1a and 2a, respectively.

A mask M2 is formed on the layer 2a using a process similar to that used for the mask M1. The mask M2 includes an aperture in line with a portion P2 of the substrate 100, which may be different or identical to the portion P1.

As was described in the case of the removal of part of the layer 1, an agent for removing the material of the layer 1a is brought into contact with the layer 2a. The portion of the upper surface of the layer 2a in which this contact takes place corresponds to the aperture of the mask M2. The material of part of the layer 1a is removed, approximately in line with the aperture of the mask M2, forming the air gap C1a. The circuit then has the configuration illustrated in FIG. 2d.

The fabrication of the circuit may then be continued in the same way as the first method of implementation.

Figure 3A:
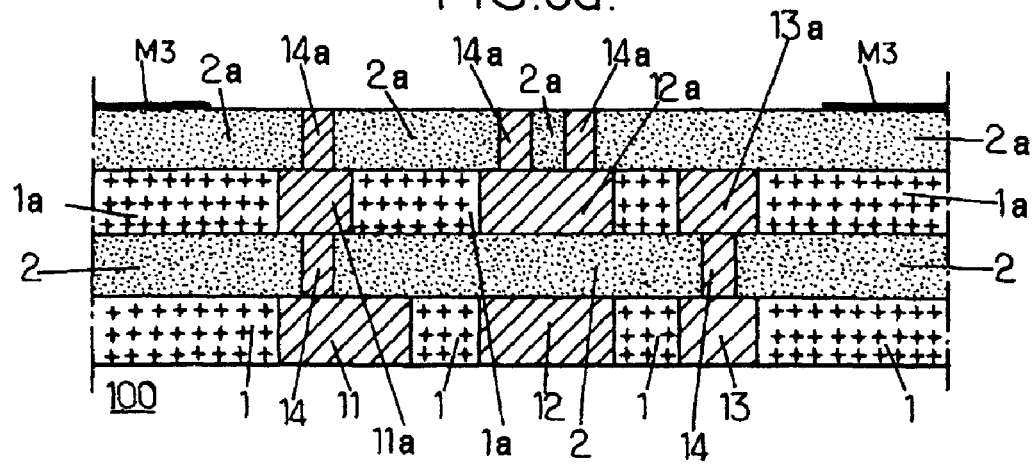
FIGS. 3a and 3b illustrate various steps of a third method of implementing the process of the invention.
Figure 3B:
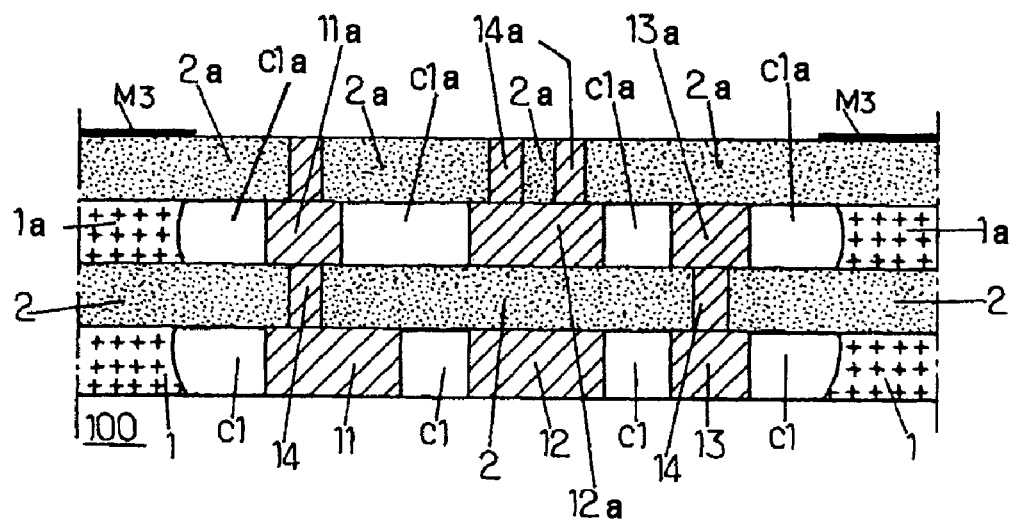

FIGS. 3a and 3b illustrate a third method of implementing the invention, which may be considered as a variant of the second method of implementation. According to this third method of implementation, the layer 1 of sacrificial material and the layer 2 of permeable material are produced in the manner described above, with the corresponding metallic elements. A second layer 1a of sacrificial material is formed on the layer 2, in which layer 1a the metallic elements 11a–13a may be placed, and then a second layer 2a of permeable material is formed on the layer 1a, with metallic elements 14a.

A mask M3 is then formed above the layer 2a. The mask M3 has an aperture that exposes part of the layer 2a. The structure shown in FIG. 3a is obtained.

The upper surface of the structure is formed by the mask M3 and the upper surface of the layer 2a at the aperture of the mask M3. It is brought into contact with a first removal agent, capable of degrading the sacrificial material of the layer 1a. Part of the material of the layer 1a is thus removed through the porous layer 2a, forming the air gap C1a. The air gap C1a is defined by the aperture of the mask M3.

Without moving the mask M3, the upper surface of the structure is then brought into contact with a second removal agent, capable of degrading the sacrificial material of the layer 1. Part of the material of the layer 1 is removed in turn, through the porous cavity 2, through the air gap 1a and through the porous layer 2a. The air gap C1 is thus formed, being defined by the aperture of the mask M3 (FIG. 3b).

In this third method of implementation, the air gaps C1 and C1a are necessarily superposed along the direction D, since they are both defined by the single mask M3.

The sacrificial materials of the layers 1 and 1a are preferably chosen so as to be removed using the same removal agent. In particular, they may be of the same type. The air gaps C1a and then C1 may then be formed during a single step of bringing the circuit into contact with the removal agent common to the two layers 1 and 1a.

The three methods of implementing the process of the invention described in detail above must not be regarded as being restricted. In particular, other methods of implementing the invention may be envisaged. It is possible to provide especially a stack consisting of alternate interconnect layers and intermediate layers, with particular combination of the various methods of defining the boundaries of the air gap formed in each interconnect layer of the stack, these being chosen from the three methods described in detail above.

Thus, the circuit may include at least first and second interconnect layers separated by an intermediate layer of a permeable material, the first interconnect layer comprising the part of the first material above the surface of the substrate outside said portion of the surface of the substrate, first interconnect elements located above said portion of the surface of the substrate, and the air gap located between said first interconnect elements in said portion of the surface of the substrate, the second interconnect layer comprising part of a second material placed above the intermediate layer outside another defined portion of the surface of the substrate, second interconnect elements located above said other portion of the surface of the substrate and at least one other air gap located between said second interconnect elements in said other portion of the surface of the substrate.

At least part of the faces of the interconnect elements may be covered with a layer of a barrier material.

In particular, said first material may be identical to the permeable material.

It is also understood within the context of the invention that several air gaps may be provided in the same interconnect layer. To do this, several parts of sacrificial material of the interconnect layer are defined, parallel to the surface of the substrate, either by a mask having several apertures, or by parts of a permanent material. The parts of sacrificial material may then be removed during a single removal step, by bringing a permeable material of an intermediate layer located above the interconnect layer into contact with an agent for removing the sacrificial material.

Finally, the process of the invention may comprise the following steps:

a) the interconnect layer is formed with the sacrificial material on the surface of the substrate in said portion;

b) the interconnect elements are formed within the interconnect layer;

c) the intermediate layer of permeable material is deposited on the interconnect layer in said portion of the surface of the substrate and on the surface of the substrate around the interconnect layer, outside said portion of the surface of the substrate; and d) all of the sacrificial material of the interconnect layer is removed through the intermediate layer.

In addition, during formation of the interconnect elements, it is possible to form a layer of a barrier material covering at least part of the faces of the interconnect elements.

From the foregoing it will be appreciated that, although specific exemplary embodiments of the invention have been described herein for purposes of illustration, various changes and modifications may be made or suggested to one skilled in the art without deviating from the scope of the invention. Accordingly, the invention is not limited except as by the appended claims. It is intended that the present invention encompass such changes and modifications as fall within the scope of the appended claims.

What is claimed is:

1. A process for fabricating an integrated electronic circuit, said integrated circuit having
a substrate,
an intermediate layer of permeable material,
an interconnect layer comprising initially a part of a sacrificial material and extending beneath the intermediate layer, and interconnect elements formed within a subpart of said part of sacrificial material of the interconnect layer, the process comprising: forming at least one air gap within the interconnect layer by removing, through the intermediate layer, at least said subpart of sacrificial material of the interconnect layer by bringing the permeable material into contact with an agent for removing the sacrificial material, to which agent the permeable material is resistant, said intermediate layer remaining rigidly linked to the substrate outside said defined portion;

whereby the at least one air gap is formed above only a defined portion of a surface of a substrate, and said defined portion being smaller than the surface of the substrate.

2. The process according to claim 1, comprising the following steps:
  a) a first part of the interconnect layer is formed with a permanent material outside said portion of the surface of the substrate;
  b) a second part of the interconnect layer is formed with the sacrificial material inside said portion of the surface of the substrate;
  c) the interconnect elements are formed within the second part of the interconnect layer;
  d) the intermediate layer of permeable material is deposited on the interconnect layer at least above said portion (P) of the surface of the substrate; and
  e) all of the sacrificial material of the interconnect layer is removed through the intermediate layer.

3. The process according to claim 2, whereby the permanent material (10) is identical to the permeable material.

4. The process according to claim 2, whereby step b) of forming the second part of the interconnect layer is carried out before step a) of forming the first part of the interconnect layer.

5. The process according to claim 4, whereby the permanent material (10) is identical to the permeable material.

6. The process according to claim 2, whereby step a) of forming the first part of the interconnect layer, step b) of forming the second part of the interconnect layer, step c) of forming the interconnect elements and step d) of depositing the intermediate layer are repeated several times before step e) of removing the sacrificial material, so as to form, above the surface of the substrate, a stack comprising several interconnect layers separated by intermediate layers of permeable material and comprising respective layers of sacrificial material above respective portions of the surface of the substrate and whereby, during step e) of removing the sacrificial material, the sacrificial material of the interconnect layers is removed by bringing the permeable material of the intermediate layers into contact with the agent for removing the sacrificial material so as to form respective air gaps in each of the interconnect layers.

7. The process according to claim 1, comprising the following steps:
  a) the interconnect layer is formed with the sacrificial material on the surface of the substrate inside said portion;
  b) the interconnect elements are formed within the interconnect layer;
  c) the intermediate layer of permeable material is deposited on the interconnect layer in said portion of the surface of the substrate and on the surface of the substrate around the interconnect layer, outside said portion of the surface of the substrate; and
  d) all of the sacrificial material of the interconnect layer is removed through the intermediate layer.

8. The process according to claim 7, whereby step a) of forming the interconnect layer, step b) of forming the interconnect elements and step c) of depositing the intermediate layer are repeated several times before step d) of removing the sacrificial material, so as to form, above the surface of the substrate, a stack comprising several interconnect layers that are separated by intermediate layers of permeable material and are surrounded, parallel to the surface of the substrate, by permeable material outside respective portions of the surface of the substrate and whereby, during step d) of removing the sacrificial material, the sacrificial material of the interconnect layers is removed by bringing the permeable material of the intermediate layers into contact with the agent for removing the sacrificial material so as to form respective air gaps in each of the interconnect layers.

9. The process according to claim 1, comprising the following steps:
  a) the interconnect layer is formed with the sacrificial material on the surface of the substrate inside and outside said portion;
  b) the interconnect elements are formed within the interconnect layer above said portion of the surface of the substrate;
  c) an intermediate layer of permeable material is deposited on the interconnect layer inside and outside said portion of the surface of the substrate;
  d) a mask impermeable to the agent for removing the sacrificial material is formed above the intermediate layer, the mask having an aperture corresponding to said portion of the surface of the substrate; and
  e) part of the sacrificial material of the interconnect layer is selectively removed through the intermediate layer, the selectively removed part of the sacrificial material being bounded by the mask in a direction parallel to the surface of the substrate.

10. The process according to claim 9, whereby the mask is formed on the intermediate layer of permeable material.

11. The process according to claim 9, whereby step a) of forming the interconnect layer, step b) of forming the interconnect elements and step c) of depositing the intermediate layer are repeated several times before step d) of forming the mask, so as to form, above the surface of the substrate, a stack comprising several interconnect layers that are separated by intermediate layers of permeable material and whereby, during step e) of removing the sacrificial material, part of the sacrificial material of the interconnect layers is selectively removed by bringing, via the aperture of the mask, the permeable material of the intermediate layers into contact with the agent for removing the sacrificial material so as to form respective air gaps in each of the interconnect layers.

12. The process according to claim 1, whereby, during formation of the interconnect elements, a layer of a baffler material covering at least part of the faces of the interconnect elements is formed.

* * * * *

UNITED STATES PATENT AND TRADEMARK OFFICE
CERTIFICATE OF CORRECTION

PATENT NO. : 7,172,980 B2 Page 1 of 1
APPLICATION NO. : 10/781565
DATED : February 6, 2007
INVENTOR(S) : Joaquin Torres, Vincent Arnal and Laurent Gosset It is certified that error appears in the above-identified patent and that said Letters Patent is hereby corrected as shown below:

Column 4, line 60, delete "image processing system" and replace with -- integrated circuit or semiconductor processing system --.

Signed and Sealed this

Nineteenth Day of June, 2007

JON W. DUDAS
*Director of the United States Patent and Trademark Office*